(12) United States Patent
Agostinelli et al.

(10) Patent No.: US 7,012,585 B2
(45) Date of Patent: Mar. 14, 2006

(54) OLED APPARATUS HAVING IMPROVED FAULT TOLERANCE

(75) Inventors: John A. Agostinelli, Rochester, NY (US); Marek W. Kowarz, Henrietta, NY (US); Fitzroy H. Crosdale, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 7 days.

(21) Appl. No.: 10/773,509

(22) Filed: Feb. 6, 2004

(65) Prior Publication Data

US 2005/0174064 A1    Aug. 11, 2005

(51) Int. Cl.
G09G 3/30    (2006.01)

(52) U.S. Cl. .......................................... 345/76; 345/82

(58) Field of Classification Search ............. 315/169.3, 315/169.4, 169.1, 168; 345/33, 36, 45, 46, 345/55, 82, 76, 77; 349/143, 144; 313/500, 313/504, 498, 505
See application file for complete search history.

(56) References Cited

U.S. PATENT DOCUMENTS

| | | | | |
|---|---|---|---|---|
| 5,828,181 | A | 10/1998 | Okuda | 315/169.3 |
| 5,844,368 | A | 12/1998 | Okuda et al. | 315/169.3 |
| 6,392,617 | B1 | 5/2002 | Gleason | 345/82 |
| 6,433,485 | B1 | 8/2002 | Tai et al. | 315/169.2 |
| 6,476,563 | B1 * | 11/2002 | Silvestre | 315/169.3 |
| 6,594,606 | B1 | 7/2003 | Everitt | 702/107 |
| 6,605,903 | B1 | 8/2003 | Swallow | 315/169.3 |
| 6,800,999 | B1 * | 10/2004 | Duggal et al. | 315/169.1 |
| 6,870,196 | B1 * | 3/2005 | Strip | 313/498 |
| 2002/0190661 | A1 | 12/2002 | Duggal et al. | 315/169.1 |
| 2003/0010985 | A1 | 1/2003 | Shen | 257/79 |
| 2003/0107537 | A1 | 6/2003 | Ochi et al. | 345/83 |
| 2004/0042205 | A1 * | 3/2004 | Tanabe et al. | 362/189 |
| 2004/0095300 | A1 * | 5/2004 | So et al. | 345/82 |

FOREIGN PATENT DOCUMENTS

| | | |
|---|---|---|
| DE | 29 42 777 A1 | 5/1981 |
| WO | WO 03/012869 | 2/2003 |
| WO | WO 03/060865 | 7/2003 |

OTHER PUBLICATIONS

"Fault-tolerant, scalable organic light-emitting device architecture" in Applied Physics Letters, vol. 82, No. 16, Apr. 21, 2003.

* cited by examiner

Primary Examiner—Wilson Lee
Assistant Examiner—Ephrem Alemu
(74) Attorney, Agent, or Firm—Raymond L. Owens

(57) ABSTRACT

An array having a plurality of column electrodes and a plurality of rows of individually addressable OLED pixels, each row including a commonly shared electrode wherein at least one OLED pixel in each row has a current limiting component and an organic electroluminescent diode and such at least one OLED pixel is connected between the commonly shared electrode and one of the plurality of column electrodes for conducting current therebetween, and wherein the at least one organic electroluminescent diode is connected in series with the current limiting component.

2 Claims, 8 Drawing Sheets

OLED APPARATUS HAVING IMPROVED FAULT TOLERANCE

FIELD OF THE INVENTION

This invention relates to fault-tolerant OLED apparatus.

BACKGROUND OF THE INVENTION

Organic light-emitting diode (OLED) technology holds significant promise as a display technology that is well suited to a broad range of applications. Self-emitting, OLED displays are advantaged over other display technologies, providing high luminance, good quality color, and relatively wide viewing angle. OLED display components are thin and lightweight, making them particularly adaptable for use with handheld components, such as cameras, cell phones, personal digital assistants (PDAs) and laptop computing devices.

The basic bottom-emitting OLED pixel 10 is constructed as shown in FIG. 1. An organic layer 12, typically fabricated as a stack of multiple thin organic layers, is sandwiched between a cathode 14 and a transparent anode 16, built onto a glass substrate 18. Organic layer 12 includes an electroluminescent layer (EL) that provides illumination when appropriate voltage is applied between anode 16 and cathode 14. Pixel 10 is formed in the overlap area between cathode 14 and anode 16. An OLED display is formed from an ordered spatial arrangement of individually addressable OLED pixels 10 arranged as an array, in successive rows and columns.

There are two basic types of OLED arrays, passive matrix and active matrix. Active matrix OLED displays integrate current control circuitry within the display itself, with separate control circuitry dedicated for each individual pixel element on the substrate for producing high-resolution color graphics at a high refresh rate. Passive matrix OLED displays, on the other hand, have current control circuitry that is only external to the display itself. Thus, passive matrix OLED displays are of simpler construction than are active matrix displays, and permit simpler, lower cost fabrication techniques.

The basic arrangement of a passive matrix OLED array 20 is shown in the simplified schematic of FIG. 2a. In array 20, each individually addressable OLED pixel 10 has an electroluminescent diode 11 connected between an anode line 26 (column) and a cathode line 24 (row). Each anode line 26 has a current source 22 that is switched ON to anode line 26 in order to illuminate pixel 10 in each column, according to image data. Cathode line 24 is commonly shared by each electroluminescent diode 11 in a row. A switch 30 for each cathode line 24 switches to ground to enable illumination of pixels 10 in each successive row, one row at a time, using a scanned row sequence. An electroluminescent diode 11 illuminates when its current source 22 is switched ON and its corresponding row switch 30 switches to ground. Otherwise, cathode lines 24 are typically switched to an intermediate voltage Vi. Electroluminescent diodes 11, whose cathode potential is at $V_i$, do not illuminate. Having its cathode line 24 at intermediate voltage Vi turns pixels 10 off for any row that is not being scanned, but maintains a potential on the row. This reduces the amount of power necessary to charge the parasitic capacitance of each row as it is addressed. Using this straightforward arrangement, passive matrix OLED array 20 can be constructed to have several thousand pixels 10, organized in a matrix of rows and columns. Control logic in a display apparatus (not shown) provides control of current source 22 for each column and of switch 30 for each row, making each OLED pixel 10 individually addressable, using control and timing techniques well known in the display component arts.

It must be emphasized that the above description and schematic of FIG. 2a provide a simplified explanation of the control mechanisms and composition of passive matrix OLED array 20. More detailed information on prior art passive matrix OLED arrays and array driver solutions can be found, for example, in U.S. Pat. No. 5,844,368 to Okuda et al. and in U.S. Pat. No. 6,594,606 Everitt.

While smaller OLED displays of several inches in diagonal have been successfully built, fabrication defects still present obstacles to the development of large area OLED displays of the passive matrix type. Defects can be due to dust or contamination during fabrication, asperities due to electrode surfaces, pinholes, and nonuniformities in organic layer thickness, for example.

Of particular concern for display operation is the defect caused by a shorted electroluminescent diode 11. Referring back to FIG. 2a, it can be observed that a shorted electroluminescent diode 11 for a pixel 10 effectively connects current source 22 directly to ground when the corresponding row is scanned. When other rows are scanned, a shorted electroluminescent diode 11 effectively sets intermediate voltage Vi onto anode line 26. Because of this, the complete column of pixels 10 is blacked out during display operation. Whereas some number of dead pixels 10 can be tolerated in a viewed image, defects affecting an entire line, in general, are not acceptable. Thus, in practice, there is zero tolerance for shorted pixel defects over the entire area of OLED array 20.

FIGS. 2b, 2c, 2d, and 2e show how various configurations of OLED array 20 behave in response to a shorted diode condition. FIGS. 2b, 2c, and 2d show OLED array 20 where switches 28 are either open or closed (to ground), without connection to intermediate voltage Vi. Referring first to FIG. 2b, there is shown a small section of OLED array 20 having electroluminescent diodes 11a, 11b, 11c, and 11d at individually addressable pixels 10a, 10b, 10c, and 10d, respectively, in an arrangement of rows 44a and 44b and columns 42a and 42b. In the example of FIG. 2b, electroluminescent diode 11d is shorted, as indicated by a short 46. During row scanning, row 44a is enabled, while adjacent row 44b is disabled, as shown at respective switches 28. Current source 22 for a column 42a is ON to illuminate pixel 10a (by providing current through electroluminescent diode 11a) at the intersection of column 42a and row 44a. However, short 46 is at the position of pixel 10d for the next row 44b at a column 42b. Short 46 thus provides an unwanted current path to column 42b, through electroluminescent diode 11c. Depending on the amount of current flowing through short 46, electroluminescent diode 11c can illuminate, thereby being permanently ON for scanning all rows 44 in array 20. Even dim constant illumination of electroluminescent diode 11c would be undesirable. As FIG. 2c shows, when both current sources 22 are ON, pixel 10c would have the desired state. As FIG. 2d shows, when row 44b is scanned, and electroluminescent diode 11c is ON, short 46 would be effectively bypassed.

Referring to FIG. 2e, there is shown an OLED array 20 arrangement in which switch 28 is at intermediate voltage Vi until a row is scanned. With short 46 in the position shown, when switch 28 for row 44b connects to idle voltage Vi and when row 44a is scanned, or any other row except row 44b is scanned, column 42b is held at Vi. Because of this, column 42b is effectively disabled. It is instructive to observe that current source 22 is designed to provide current to only a single electroluminescent diode 11 at a time; meanwhile, intermediate voltage Vi is provided to a full row 44a, 44b. It would be unpractical to size current source 22 in each column 42a, 42b to compensate for the condition caused by short 46.

The likelihood of a fabrication defect increases dramatically as the display area increases. Assuming that the overall defect density for array 20 exhibits a Poisson distribution characteristic, then the probability that array 20 has zero defects is the yield Y and can be expressed in the equation (1):

$$Y = e^{-DA} \qquad (1)$$

where D is the shorting defect density per area and, for a shorted diode 11, A is the full area of array 20.

The exponential scaling impact of defect density D and area A is particularly significant. For example, for a reasonable defect density D of 0.01 per cm and an area A of 0.5 square meter, the yield Y is as follows:

$$Y = 2 \times 10^{-22}.$$

In other words, chances for a good display yield with a very large passive matrix OLED display are effectively nil. Only a dramatic reduction of factors D and A in the exponent of equation (1) can permit a reasonable yield for OLED arrays.

Active matrix OLED design provides one solution to this defect-related performance problem. In an active matrix OLED array, each individual OLED pixel 10 can be independently addressed, using an arrangement of thin-film transistors (TFTs) and storage capacitors. Active matrix display circuitry is disclosed in U.S. Pat. No. 6,392,617 to Gleason and U.S. Pat. No. 6,433,485 to Tai et al., for example. With an active matrix configuration, a shorted diode defect at any one OLED pixel 10 does not impact other OLED pixels 10. However, as is noted above, active matrix OLED array design is considerably more complex, requiring a number of additional support components for each OLED pixel 10.

U.S. Pat. No. 6,605,903 to Swallow discloses, as an alternative passive matrix approach, an array having sections that can be selectively activated or deactivated to compensate for OLED pixel 10 defects. In the OLED array of U.S. Pat. No. 6,605,903, each column has two separate sections, either of which can be activated or deactivated in the event of a shorted diode. While this approach can mitigate defect problems, the array requires a considerable number of additional components, many of which would not be used. Moreover, defects occurring after manufacture, and testing would still have a negative effect on display performance.

Although clearly not directed to an OLED array used for addressable image display, one solution proposed for large-scale OLED cells or modules used in room lighting and signage applications, outlined in U.S. Patent Application Publication 2002/0190661 A1 to Duggal et al., is of some interest. U.S. Patent Application Publication 2002/0190661 A1 discloses a serial connection of multiple, large area OLED modules directly to an AC power source. Each OLED cell or module is a single diode, having an emissive surface that is at least a few square centimeters in area. OLED cells are connected in series fashion, with the anode of one OLED cell connected to the cathode of the previous one, for example. Advantageously for the lighting and signage lettering uses described in U.S. Patent Application Publication 2002/0190661 A1, this solution permits OLED devices to be used with alternating current at line voltage (nominally at 120 VAC, 60 Hz), so that a separate DC power supply is not required. Series-connected OLED cells are arranged to illuminate during each half cycle of AC current. In a paper entitled "Fault-tolerant, scalable organic light-emitting device architecture" in *Applied Physics Letters*, Vol. 82, Number 16, 21 Apr. 2003, this type of series connection for large area OLED cells for illumination applications is also disclosed and further discussed with reference to the impact of faults on other OLED devices in the series. Not surprisingly, a shorted OLED cell diode in the series causes a corresponding increase in brightness among other OLED cells in the same series. However, the straightforward series connection described does have advantages over more complex fault response mechanisms.

Thus, while there have been a few solutions proposed for limiting or minimizing the impact of a faulted OLED on other nearby OLEDs, none of these solutions is particularly well suited for use with a passive matrix OLED array used in imaging display applications, where each OLED electroluminescent diode 11 serves as one individually addressable pixel 10 for forming an image. The active matrix designs disclosed in U.S. Pat. Nos. 6,392,617 and 6,433,485 add considerable complexity, as does the dual-column solution disclosed in U.S. Pat. No. 6,605,903. The solution proposed in U.S. Patent Application Publication 2002/0190661 A1 applies for discrete, modular OLED lighting devices that are used as banks of large-scale illuminators, rather than for OLED arrays where each individually addressable OLED electroluminescent diode 11 serves as one pixel 10 for forming an image. In considering any practical solution, it can be appreciated that there are benefits in maintaining the low cost and relative simplicity of the passive matrix OLED array design, as is shown in the schematic diagram of FIG. 2.

Thus, it can be seen that there is a need for an OLED array apparatus providing multiple individually addressable pixels and a method that provides a degree of tolerance to short conditions without adding substantial fabrication complexity or requiring complex support circuitry.

SUMMARY OF THE INVENTION

It is an object of the present invention to provide an OLED array having improved fault tolerance. The present invention provides an array having a plurality of column electrodes and a plurality of rows of individually addressable OLED pixels, each row including a commonly shared electrode, comprising:

a) wherein at least one OLED pixel in each row has a current limiting component and an organic electroluminescent diode and such at least one OLED pixel is connected between said commonly shared electrode and one of the plurality of column electrodes for conducting current therebetween; and b) wherein the at least one organic electroluminescent diode is connected in series with the current limiting component.

It is a feature of the present invention that it provides a pixel having an electroluminescent diode in series with a current limiting component.

It is an advantage of the present invention that it employs passive components in series with the electroluminescent diode, rather than requiring the use of active components, such as switching transistors, for each OLED pixel or row of pixels. The solution of the present invention provides a low-cost addition to OLED array fabrication that reduces the likelihood of a dark OLED line defect in a display.

It is a further advantage of the present invention that it permits increased yields in OLED array manufacture by limiting one cause of line dropout due to shorting of a single pixel.

It is a further advantage of the present invention that it provides a manufacturing method for isolating shorted pixels to minimize their impact on OLED array performance.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

FIG. 3b is a plan view representation of OLED components for the first embodiment shown in FIG. 3a;

FIG. 4b is a plan view representation of OLED components for the second embodiment shown in FIG. 4a;

FIG. 5b is a plan view representation of OLED components for the third embodiment shown in FIG. 5a;

FIG. 6b is a plan view representation of OLED components for the fourth embodiment shown in FIG. 6a;

DETAILED DESCRIPTION OF THE INVENTION

The present description is directed in particular to elements forming part of, or cooperating more directly with, apparatus in accordance with the present invention. It is to be understood that elements not specifically shown or described can take various forms well known to those skilled in the art.

The present invention addresses the problem of protection from a shorted diode by introducing a current limiting element in series with the electroluminescent diode 11 within OLED pixel 10. Various different types of current limiting elements can be used, singly or in combination, as is described for each of the embodiments outlined below.

Figure 1:
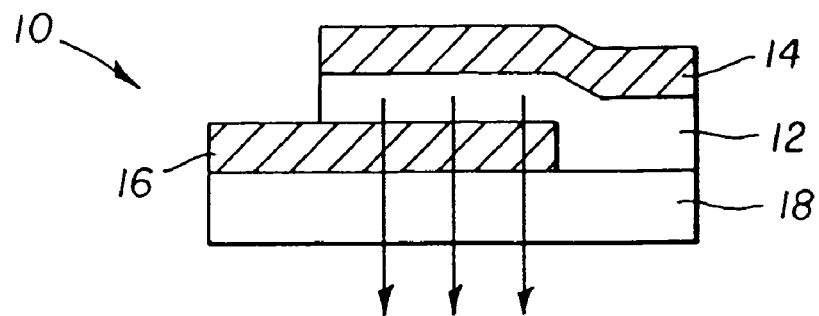
FIG. 1 is a cutaway side view showing the basic components of a prior art OLED pixel.
Figure 2A:
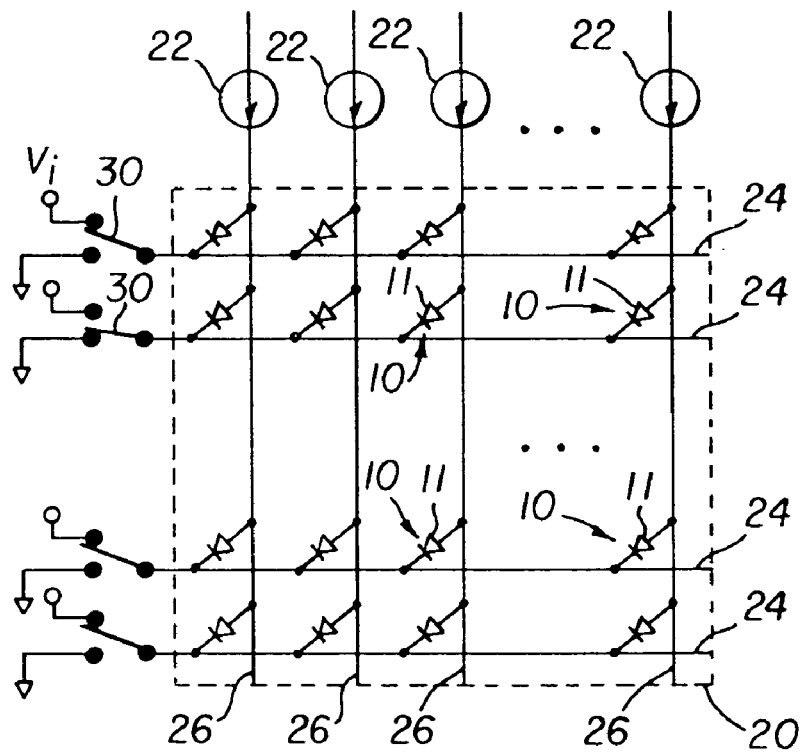
FIG. 2a is a schematic diagram showing the basic arrangement of a prior art passive matrix OLED array.
Figure 2B:
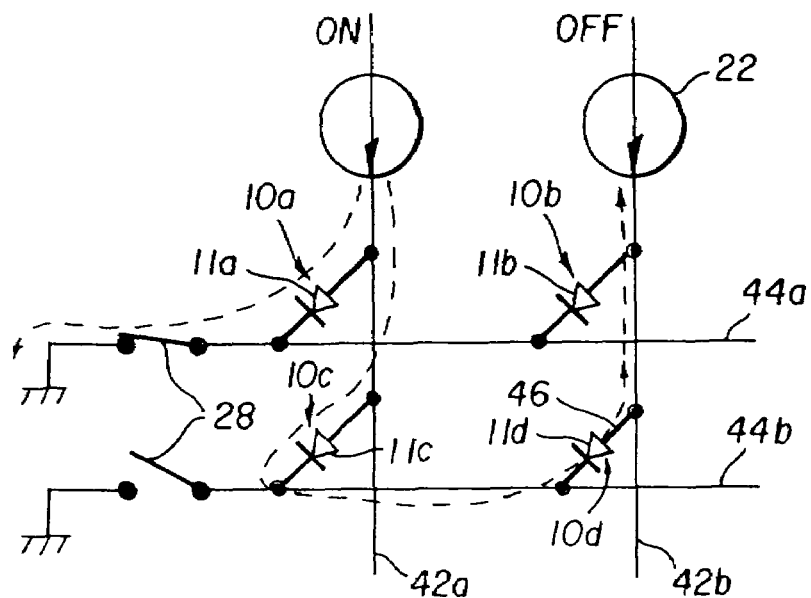
FIGS. 2b, 2c, 2d, and 2e are schematic diagrams showing a segment of a prior art passive matrix OLED array having a short, under various current source and row scanning conditions.
Figure 2C:
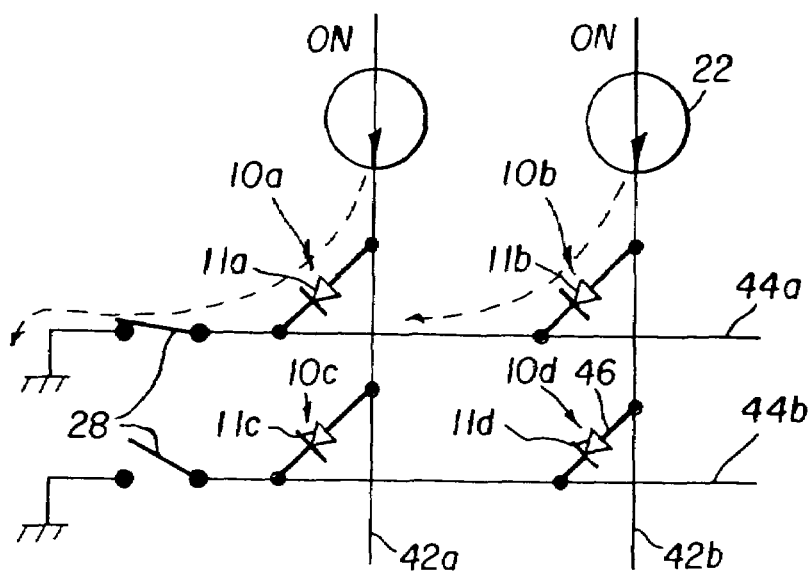
Figure 2D:
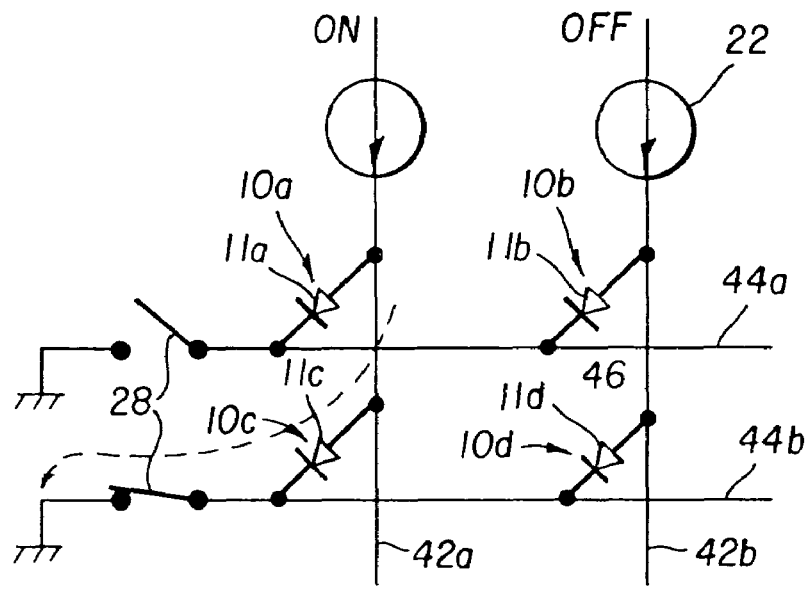
Figure 2E:
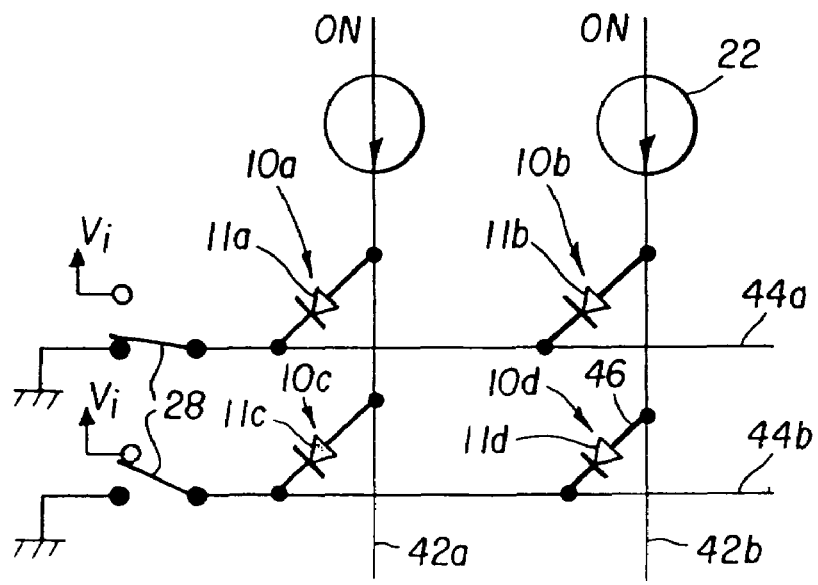
Figure 3A:
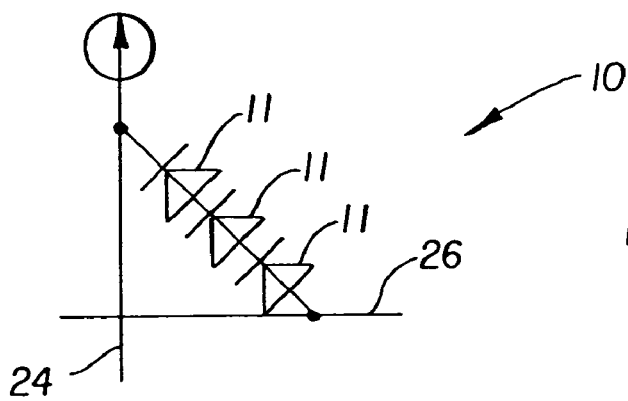
FIG. 3a is a schematic diagram showing an OLED pixel arrangement in a first embodiment of the present invention.

Referring to FIG. 3a, there is shown a first embodiment of the present invention, wherein a plurality of electroluminescent diodes 11 are connected in series within each single OLED pixel 10. In this top-emitting configuration, the cathode is transparent. With this arrangement, shorting of one electroluminescent diode 11 simply adds to the current load of the other electroluminescent diode(s) 11 connected in series within OLED pixel 10. Electroluminescent diodes 11 can be themselves the current limiting elements, in which case, each diode 11 within OLED pixel 10 provides some portion of the overall emitted light. Alternately, one or more of the series-connected diodes could be a diode that does not emit light, but simply acts as a current limiting element.

Figure 3B:
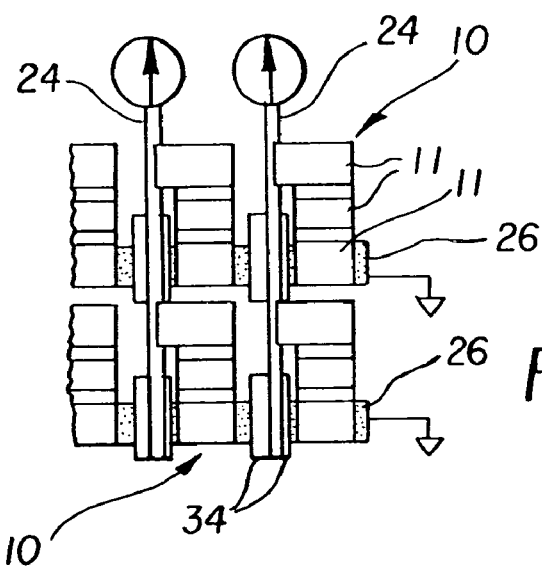
Figure 3C:
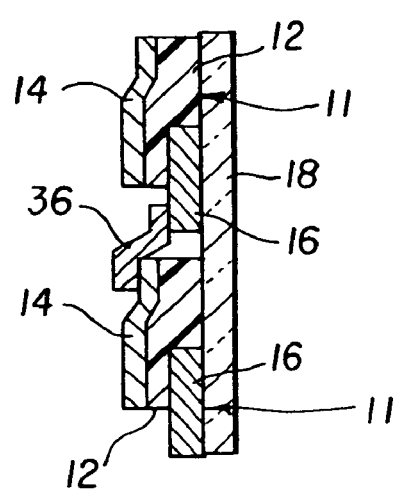
FIG. 3c is a cutaway side view showing OLED pixel components for the first embodiment.

Referring to FIG. 3b, there is shown a plan view of component positioning within OLED pixel 10 for this first embodiment. Electroluminescent diodes 11 are formed from suitably doped OLED materials and are arranged in series, such that the cathode of one electroluminescent diode 11 connects to the anode of the next electroluminescent diode 11. As is shown in the side view of FIG. 3c, a jumper 36 makes this connection between cathode 14 and anode 16. At each electroluminescent diode 11 position, an insulator 34 is provided to isolate anode line 26 from cathode line 24.

This first display embodiment admits a number of alternative arrangements. For example, the number of series electroluminescent diodes 11 can be varied based on factors such as driver characteristics. The greater the number of electroluminescent diodes 11 connected in series within OLED pixel 10, the greater is the relative insensitivity to a short condition. However, at the same time, the voltage required to drive pixel 10 increases with an increased number of series-connected electroluminescent diodes 11.

Figure 4A:
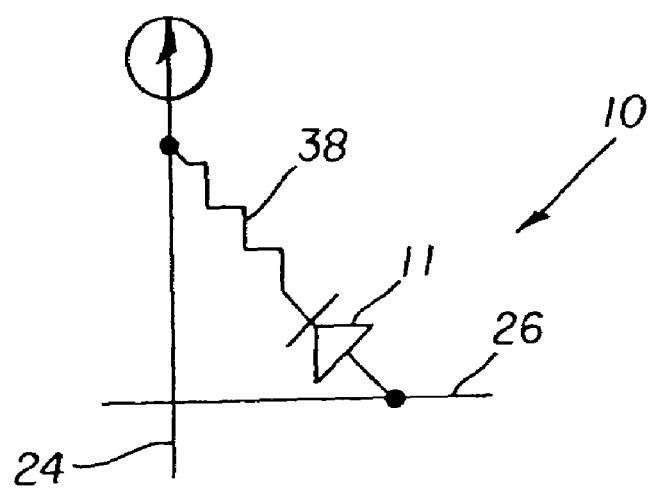
FIG. 4a is a schematic diagram showing an OLED pixel arrangement in a second embodiment of the present invention.
Figure 4B:
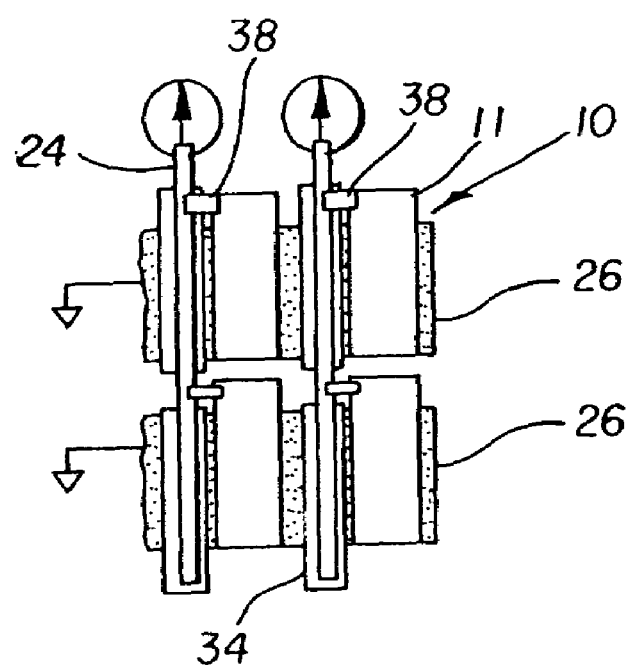

Referring to FIG. 4a, there is shown, in schematic form, a second embodiment in which OLED pixel 10 employs a series resistor 38 for current limiting. The resistance value of series resistor 38 would be selected with a suitable value for limiting current if electroluminescent diode 11 is shorted. Referring to FIG. 4b, there is shown a plan view of component positioning within OLED pixel 10 for this second embodiment. Series resistor 38 connects from the cathode of electroluminescent diode 11 in the embodiment shown; however, series connection of resistor 38 at the anode would be equivalent for providing current limiting protection.

This second display embodiment also admits a number of alternative arrangements, including combination with other embodiments. For example, series resistor 38 could be used in OLED pixel 10 that contains two or more electroluminescent diodes 11.

Figure 5A:
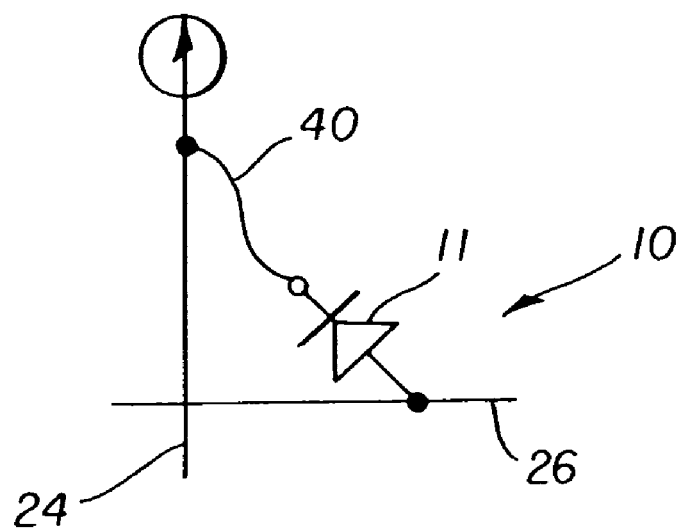
FIG. 5a is a schematic diagram showing an OLED pixel arrangement in a third embodiment of the present invention.
Figure 5B:
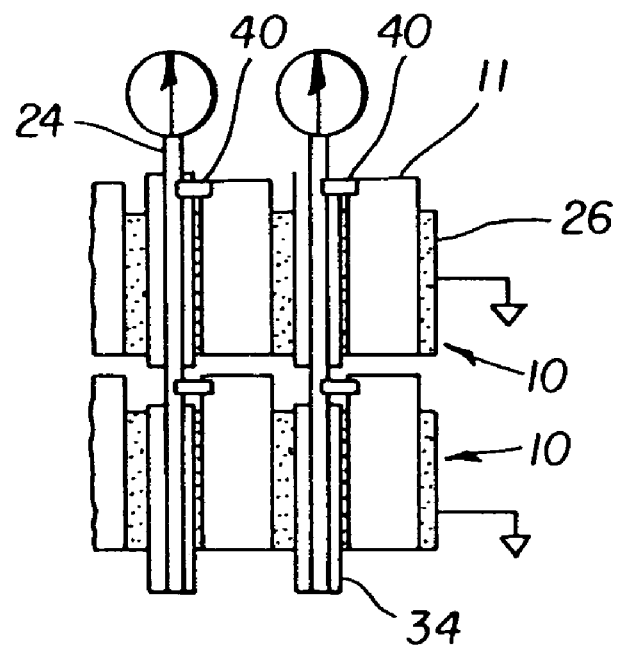

Referring to FIG. 5a, there is shown, in schematic form, a third embodiment in which OLED pixel 10 employs a fuse 40 for current limiting. An overcurrent condition caused by shorting of electroluminescent diode 11 would blow fuse 40, effectively causing an open circuit for this OLED pixel 10. A single dark pixel would result; however, other pixels from other OLED pixel 10 would not be affected by this failure. Referring to FIG. 5b, there is shown a plan view of possible component positioning within OLED pixel 10 for this third display embodiment, with fuse 40 connected between the cathode of electroluminescent diode 11 and cathode line 24. It can be appreciated that fuse 40 can alternately be connected between the anode of electroluminescent diode 11 and anode line 26 or between the cathode of electroluminescent diode 11 and cathode line 24. Alternative variations on the embodiment of FIGS. 6a and 6b include series combination of fuse 40 with multiple electroluminescent diodes 11 or with other current limiting elements in series.

Fuse 40 can be fabricated using any of a number of materials and techniques. Materials useful for forming fuses are generally alloys that have a relatively low melting point. In particular, binary, ternary, quaternary, and quinternary alloys selected from the elements Bi, In, Pb, Sn, and Cd are preferred. By way of example, but not of limitation, fuse 40 materials could include any of the following:

a) quinternary eutectic alloy Bi(44.7%) Pb(22.6%) In(19.1%) Sn(8.3%)Cd(5.3%) which has a melting point of 47° C.;

b) quaternary Wood's Metal (Bi(50.0%) Pb(25.0%) Sn(12.5%) Cd(12.5%)) having a melting point of 70° C.;

c) ternary eutectic Bi(52.5%) Pb(32.0%) Sn(15.5%) with a melting point of 95° C.; or d) binary eutectic solder (Sn(63%) Pb(37%)) that melts at 183° C.

It can be appreciated that many other eutectic and non-eutectic alloys of these and other elements are useful for forming fuse 40 according to the present invention.

Fuse 40 has an added advantage during fabrication of OLED array 20. Where electroluminescent diode 11 at any pixel 10 is shorted, it would be advantageous to selectively open the circuit connection, effectively isolating and disabling pixel 10 at that location. Applying a high reverse-bias voltage to array 20 would direct a high level of current only through shorted pixels 10. By a applying a reverse-bias voltage of sufficient value, only those fuses 40 at pixels 10 having shorted electroluminescent diodes 11 would be blown. This would enable high yields. With respect to yield equation (1) given earlier, area A is greatly reduced, effectively to the dimensions of a single pixel 10 area.

Figure 6A:
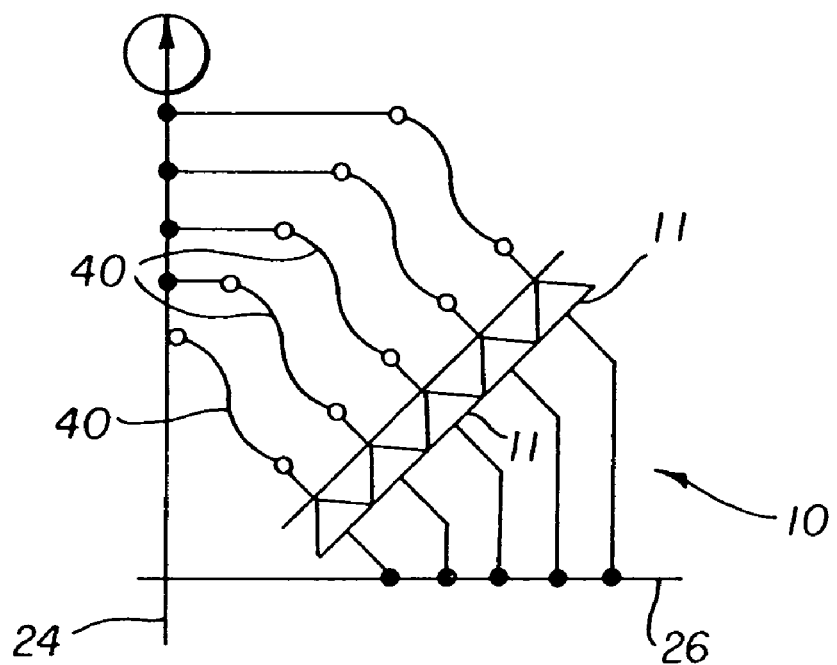
FIG. 6a is a schematic diagram showing an OLED pixel arrangement in a fourth embodiment of the present invention.

Referring to FIG. 6a, there is shown a fourth embodiment of the present invention, in which, for any single OLED pixel 10, multiple electroluminescent diodes 11 are disposed electrically in parallel between anode line 26 and cathode line 24, each electroluminescent diode 11 having a separate series fuse 40. With this arrangement, shorting of a single electroluminescent diode 11 blows its corresponding fuse 40, opening this part of the circuit, but permitting continued flow of current through other electroluminescent diodes 11 connected in parallel. Unlike the arrangement of the third display embodiment, however, separate material need not be used to fabricate fuse 40. Instead, the current-carrying capacity of OLED materials themselves, or that of nearby cathode or anode support structures, effectively provides a fusing element with this embodiment. An overcurrent condition melts or burns away conductive material that forms electroluminescent diode 11, opening the circuit at that point.

Figure 6B:
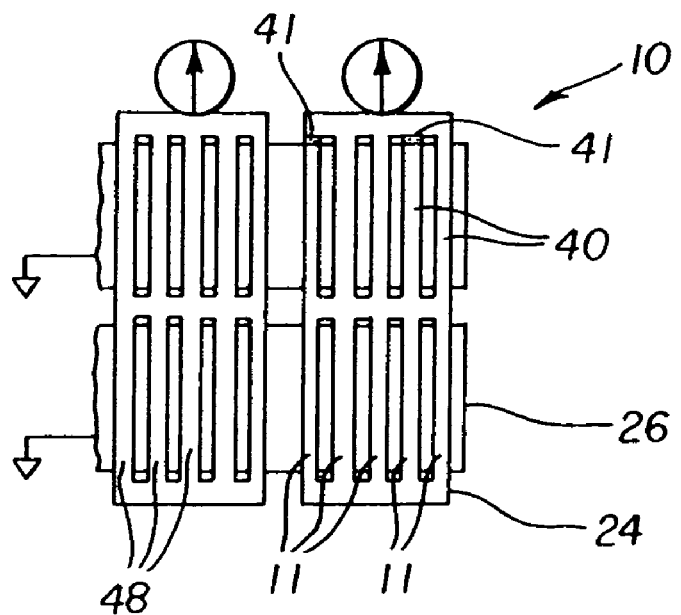

Referring to FIG. 6b, there is shown a plan view of component positioning within OLED pixel 10 for this fourth display embodiment. Five OLED pixels 10 are shown. Each parallel electroluminescent diode 11 within OLED pixel 10 is formed by the light-emitting organic material that lies between a thin strip 48 of cathode 14 material and the underlying anode 16 material. This patterning of cathode 14 into parallel thin strips 48, spaced apart in the overlap region between cathode 14 and anode 16 where electroluminescent diodes 11 form, enables multiple electroluminescent diodes 11 to be fabricated as a set of parallel sub-pixel elements for pixel 10. Electrode material that is not in the diode-forming area is conductive and has a limited current-carrying capacity. In particular, OLED material in a fuse area 41, not directly in the overlap area between cathode and anode lines 24 and 26, as indicated in FIG. 6b, is likely to be damaged and produce an open electrical condition when subjected to excessive current. However, because cathode 14 is segmented into thin strips 48, it is also possible that an overcurrent condition would cause melting anywhere along the length of thin strip 48 wherein electroluminescent diode 11 is shorted. In this way, all of thin strip 48 would serve as a fusing mechanism. Note that anode 16 could be similarly formed using sections of strips to effect fuse behavior. For thermal considerations, thin strips 48 work best when formed on the electrode that is not in direct contact with the substrate. Otherwise, the substrate could provide unwanted dissipation of the heat that could otherwise cause the fuse to open.

Addition of a separate fusing component for providing fuse 40 to implement the embodiment of FIG. 6a is one alternative. However, the overall arrangement of FIG. 6b offers advantages for manufacturability, since it does not require that a separate type of fusing material be introduced into OLED array 20 fabrication processes.

A hybrid arrangement is also possible, using some combination of localized overheating of OLED material, overheating of anode 16 or cathode 14 segments, or use of a fuse material, as was described with respect to the third display embodiment. Alternative arrangements of this fourth embodiment also include replacing one or more fuses 40 with a corresponding series resistor 38. As another alternative, one or more parallel circuits could use an arrangement with multiple electroluminescent diodes 11 connected in series within each circuit.

Fault tolerance solutions provided for individually addressable OLED pixels 10 in an array 20 can also have application to large-scale OLED cells used for area lighting, where the OLED cells are not individually addressed, but are energized at the same time. In particular, the solutions offered by the third and fourth display embodiments in the schematic diagrams of FIGS. 5a and 6a could have particular usefulness with large-area OLEDs used for room or other area lighting devices. As was noted in the background section hereinabove, series connection of large-scale OLED cells or modules has been proposed for the purpose of permitting an apparatus including multiple OLED cells to connect directly to AC line current for lighting applications. As is noted in U.S. Patent Application Publication 2002/0190661 A1, series connection of these devices also provides a measure of fault tolerance in the event of a short to any individual OLED cell.

Figure 7:
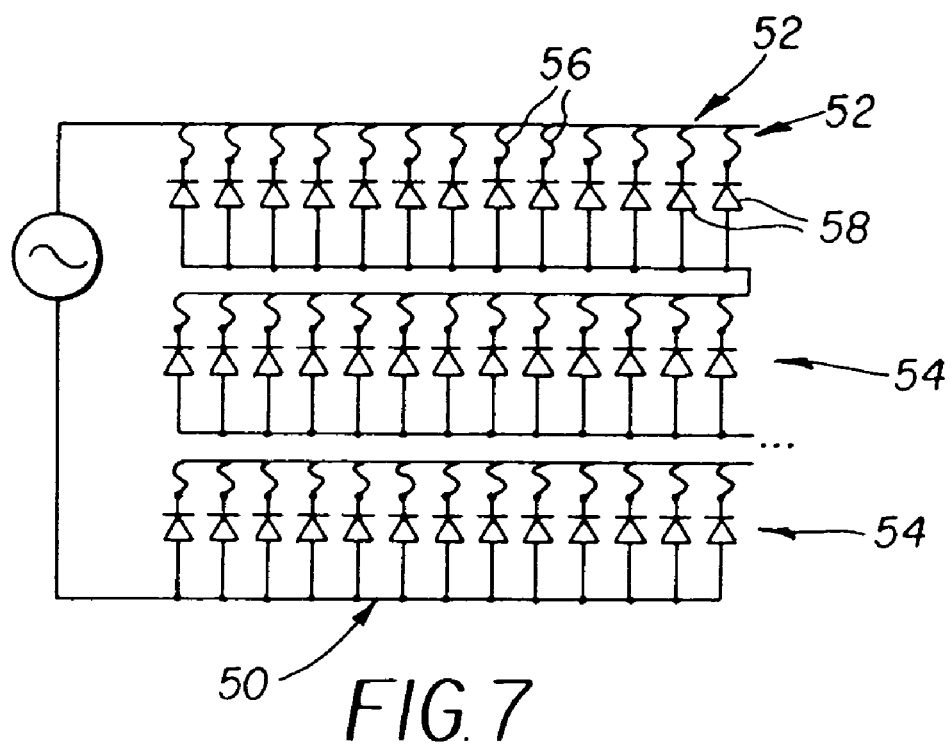
FIG. 7 is a schematic diagram showing an arrangement of OLED cells in an embodiment of an area lighting apparatus, using the techniques of the present invention.

Referring to FIG. 7, there is shown an area lighting apparatus 50 having an array of large-scale OLED cells 52. Each OLED cell 52 is formed by connecting a single, large-scale OLED diode 58 in series with a fuse 56. A bank 54 of OLED cells 52 is then formed by connecting a plurality of OLED cells 52 in parallel. Bank 54 could provide a usable area lighting apparatus 50 or module; however, a more practical application would connect successive banks 54 of OLED cells 52 in series, as is shown in FIG. 7. Using this fault-tolerant arrangement, a short at any large scale OLED diode 58 in OLED cell 52 blows its corresponding fuse 56, but permits neighboring OLED cells 52 in the same bank 54 of OLED cells 52 to function.

The arrangement of FIG. 7 would be suitable for application of AC power, particularly when using series-connected banks 54. However, with the arrangement of FIG. 7, OLED cells 52 would illuminate only during alternate half-cycles. By reversing the orientation of some OLED cells 52, alternate groups of OLED cells 52 would be illuminated with each half-cycle of AC current.

Figure 8:
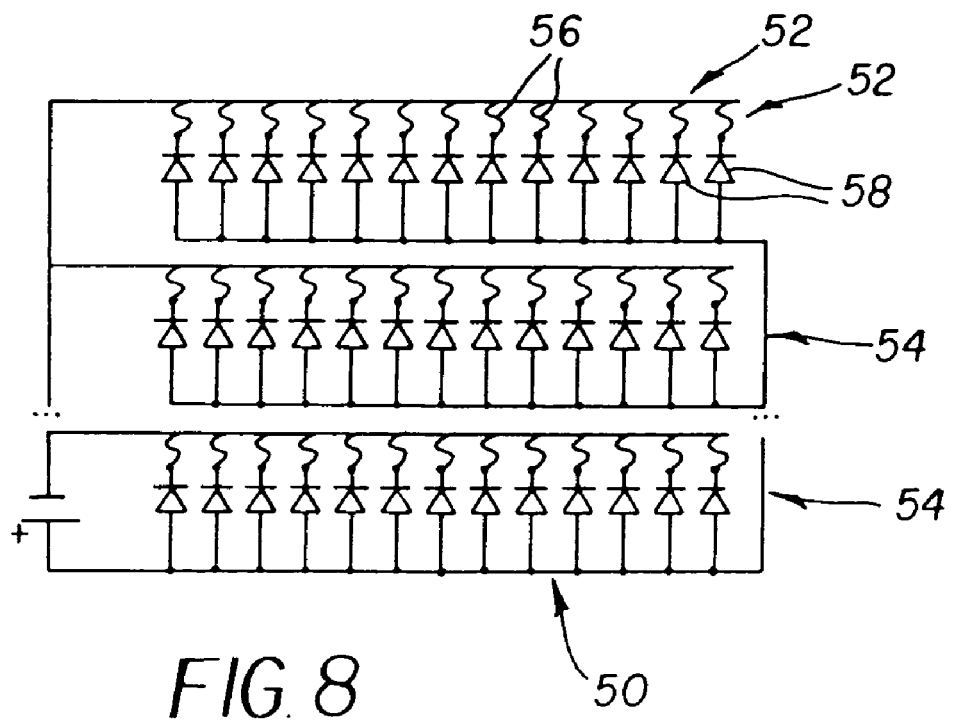
FIG. 8 is a schematic diagram showing an alternate arrangement of OLED cells in an embodiment of an area lighting apparatus using a DC source, using the techniques of the present invention.

Referring to FIG. 8, there is shown an arrangement of banks 54 of OLED cells 52 for an embodiment of area lighting apparatus 50 using a DC power source. Here, banks 54 of OLED cells 52 are formed as in the embodiment of FIG. 7, but are connected in parallel across the DC source. This lighting arrangement can be especially well suited to automotive applications and other environments using battery current or other DC sources.

Unlike active matrix OLED arrays that employ transistor switches and their necessary support components, the overall approach of the display embodiments of FIGS. 3a, 3b, 3c, 4a, 4b, 5a, 5b, 6a, and 6b uses simple current limiting components, such as additional electroluminescent diodes 11, passive resistors 38, or fuses 40, arranged in series with electroluminescent diode 11.

Using the display embodiments of FIGS. 3a, 3b, 3c, 4a, 4b, 5a, 5b, 6a, and 6b, manufacturing yields would be increased without significant cost impact. In terms of equation (1) in the Background of the Invention, the effective area A of a fault is reduced to a pixel 10 area using these methods, rather than the area A of the complete display.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, the various current limiting solutions of the embodiments described hereinabove could be combined with each other to achieve a favorable component arrangement. Designation of row and column electrodes and device polarity could be reversed in practice for implementing some of the embodiments disclosed herein. In the spirit of the invention, series-connected current limiting components could be connected to either anode or cathode terminals of electroluminescent diodes 11, depending on ease of fabrication. The present invention could be applied to both top- and bottom-emitting OLED architectures.

PARTS LIST

10 OLED pixel
10a, 10b, 10c, 10d pixel
11 electroluminescent diode
11a, 11b, 11c, 11d electroluminescent diode
12 organic layer
14 cathode
16 anode
18 substrate
20 passive matrix OLED array
22 current source
24 cathode line
26 anode line
28 switch
30 switch
34 insulator
36 jumper
38 resistor
40 fuse
41 fuse area
42a, 42b column
44a, 44b row
46 short
48 strip
50 area lighting apparatus
52 OLED cell
54 bank
56 fuse
58 large-scale OLED diode

What is claimed is:

1. An array having a plurality of column electrodes and a plurality of rows of individually addressable OLED pixels, each row including a commonly shared electrode, comprising:
   a) wherein at least one OLED pixel in each row has at least two organic electroluminescent diodes and such that the at least one OLED pixel is connected between the commonly shared electrode and one of the plurality of column electrodes for conducting current therebetween; and
   b) wherein the at least two organic electroluminescent diodes are connected in series so that if the one of the at least two organic electroluminescent diodes contains a short the other will function as a current limiting component and the OLED pixel will still produce light.

2. The array of claim 1 wherein there are at least three organic electroluminescent diodes in each OLED pixel.

* * * * *